United States Patent
Su et al.

(10) Patent No.: US 10,711,103 B2
(45) Date of Patent: Jul. 14, 2020

(54) DCPD-DERIVED POLYETHER AND METHOD OF PRODUCING THE SAME

(71) Applicant: NATIONAL CHUNG SHAN INSTITUTE OF SCIENCE AND TECHNOLOGY, Taoyuan (TW)

(72) Inventors: Wen-Chiung Su, Taoyuan (TW); Ching-Hsuan Lin, Taichung (TW); Wei-Feng Hsiao, Taichung (TW); Han-Ya Lin, Taichung (TW)

(73) Assignee: NATIONAL CHUNG SAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 0 days.

(21) Appl. No.: 15/826,861

(22) Filed: Nov. 30, 2017

(65) Prior Publication Data
US 2019/0048137 A1    Feb. 14, 2019

(30) Foreign Application Priority Data
Aug. 10, 2017 (TW) ............... 106126994 A

(51) Int. Cl.
*C08G 65/48* (2006.01)
*C08G 65/40* (2006.01)
(Continued)

(52) U.S. Cl.
CPC ......... *C08G 65/48* (2013.01); *C08G 59/4071* (2013.01); *C08G 65/4012* (2013.01);
(Continued)

(58) Field of Classification Search
CPC ........ C08G 79/04; C08K 3/36; C08K 5/5435; B32B 5/26; B32B 15/14; B32B 2260/023;
(Continued)

(56) References Cited

U.S. PATENT DOCUMENTS

| 8,791,214 B2 | 7/2014 | Takeuchi et al. |
| 2013/0059127 A1* | 3/2013 | Peters ................ C08G 65/485 428/195.1 |
| 2014/0323666 A1* | 10/2014 | Lin ..................... C08G 65/485 525/392 |
| 2016/0130406 A1* | 5/2016 | Hsieh ................... C08G 79/04 428/141 |

FOREIGN PATENT DOCUMENTS

| CN | 101565503 A | 10/2009 |
| JP | 2000178329 A | 6/2000 |
| TW | 201141909 A | 12/2011 |

OTHER PUBLICATIONS

Wang et al., Journal of Applied Polymer Science, vol. 88, 2607-2613 (2003).*

(Continued)

*Primary Examiner* — Shane Fang
(74) *Attorney, Agent, or Firm* — Schmeiser, Olsen & Watts, LLP

(57) ABSTRACT

A low-k, non-flammable dicyclopentdiene (DCPD)-derived polyether and a method of producing the same are introduced. Incorporation of a phosphorus group and a DCPD derivative into a low-k, non-flammable dicyclopentdiene (DCPD)-derived polyether enable the DCPD-derived polyether to not only serve as an epoxy resin curing agent but also cure itself such that the cured product not only features satisfactory thermal properties and low-k characteristics but is also non-flammable.

7 Claims, 11 Drawing Sheets

R=

(51) Int. Cl.
*C08G 59/40* (2006.01)
*H05K 1/03* (2006.01)

(52) U.S. Cl.
CPC ......... *H05K 1/0326* (2013.01); *H05K 1/0353* (2013.01); *C08G 2650/02* (2013.01); *C08G 2650/40* (2013.01); *C08G 2650/64* (2013.01); *H05K 2201/012* (2013.01)

(58) Field of Classification Search
CPC ...... B32B 2260/046; B32B 2262/0269; B32B 2262/101; B32B 2307/204; B32B 2307/306; B32B 2307/3065; B32B 2457/08; H05K 1/0366
See application file for complete search history.

(56) References Cited

OTHER PUBLICATIONS

Ching Hsuan Lin—An Approach of Modifying Poly(Aryl Ether Ketone) to Phenol-Containing Poly(Aryl Ether) and Its Application in Preparing High-Performance Epoxy Thermosets; Polymer 54 (2013) 1612-1620.

Hann-Jang Hwang—Dielectric Behavior and Properties of a Cyanate Ester Containing Dicyclopentadiene: Journal of Applied Polymer Science, vol. 96, 2079-2089 (2005).

Hann-Jang Hwang—Synthesis and Properties of Bismaleimide Resin Containing Dicyclopentadiene or Dipentene; *Polym Int* 55:1341-1349 (2006).

\* cited by examiner

R=

DCPD-DERIVED POLYETHER AND METHOD OF PRODUCING THE SAME

CROSS-REFERENCE TO RELATED APPLICATION

This non-provisional application claims priority under 35 U.S.C. § 119(a) on Patent Application No(s). 106126994 filed in Taiwan, R.O.C. on Aug. 10, 2017, the entire contents of which are hereby incorporated by reference.

FIELD OF THE INVENTION

The present invention relates to DCPD-derived polyethers and methods of producing the same and, more particularly, to a low-k, non-flammable DCPD-derived polyether and a method of producing the same.

BACKGROUND OF THE INVENTION

Among polymeric materials, epoxy resin material has long been in use in coating and semiconductor packaging, because it is resistant to solvents, easy to process, and suitable for use with an appropriate curing agent. Rapid development of electronic products is accompanied by increasingly strict restriction of application of epoxy resin because of its disadvantages: high flammability and high dielectric constant. Highly ductile and thermally stable, aromatic polyethers are suitable for use as epoxy resin tougheners. commercially-available aromatic polyethers used as tougheners are mostly provided in the form of oligomers such that a terminal reacting group thereof serves to cure epoxy resins. However, owing to a scarcity of their reacting groups, aromatic polyethers cannot work without any curing agent. Hence, their modifying function with respect to epoxy resins still has room for improvement.

To this end, the industrial sector developed a polyether with an active group, which is not only capable of curing and toughening, but also effective in improving the characteristics and applications of epoxy resins. In 2013, Lin and others (*Polymer*, 2013, 54 (6), 1612-1620) disclosed producing, by one-pot reaction, polyetheretherketone (PEEK) and polysulfones which have repeating units. The repeating units each have an active group and a flame-retarding structure. The active group of the repeating unit contributes to flexible applications of polymers. The hydroxyl group of the structure serves as an epoxy resin curing agent. The phosphorus-based structure renders a cured product flame-retarding and cures epoxy resins to thereby achieve a satisfactory glass transition temperature Tg. However, the hydroxyl group produces high-polarity secondary alcohol while curing epoxy resins, and thus remains unsatisfactory in terms of the dielectric constant.

In 2014, U.S. Pat. No. 8,791,214 B2 disclosed esterification of phenolic compounds, namely phenol novolac (PN) and dicyclopentadiene phenol novolac (DCPDPN), by mono-group or bi-group acyl chloride before the resultant ester cures epoxy resin HP7200, wherein ring-opening reactions of the epoxy resin is accompanied by transesterification which takes place in the presence of an active ester. After the epoxy resin has been cured, production of high-polarity secondary alcohol is impossible and thus conducive to a reduction in the dielectric constant. However, after reacting with the epoxy resin, the active ester substitutes for the hydroxyl group of the ring-opened epoxy resin and thus weakens intermolecular hydrogen bonds, thereby lowering the Tg of the cured product.

In addition to modifying an active hydroxyl group, dicyclopentdiene (DCPD) is easy to process because it is a high-rigidity aliphatic dicyclic compound and a promising green material. In 2004, Huang and others (*Journal of Applied Polymer Science*, 2005, 96, 2079-2089) disclosed introducing DCPD into cyanate ester and comparing it with commercially-available bisphenol A cyanate ester, and the findings showed a marked decrease in its dielectric constant. In 2006, Huang and others (*Polymer International*, 2006, 55, 1341-1349) disclosed introducing DCPD into bismaleimide to prove that its cured product has satisfactory dielectric characteristics.

The above citation documents show that introduction of a polyether into DCPD is conducive to improvement of electrical characteristics and enhancement of processability. Hence, the industrial sector currently needs a method of producing a DCPD-derived polyether and thereby producing a polyether material which not only features low-k characteristics, high thermal properties, and high mechanical strength, but is also non-flammable and curable, so that the polyether material can be applied to optoelectronics.

SUMMARY OF THE INVENTION

In view of the aforesaid drawbacks of the prior art, it is an objective of the present invention to provide a method of producing a low-k, non-flammable dicyclopentdiene (DCPD)-derived polyether such that the DCPD-derived polyether not only serves as an epoxy resin curing agent, but is also capable of curing itself and thereby applicable to substrates of printed circuit boards.

In order to achieve the above and other objectives, the present invention provides a DCPD-derived polyether expressed by structural formula (I) below,

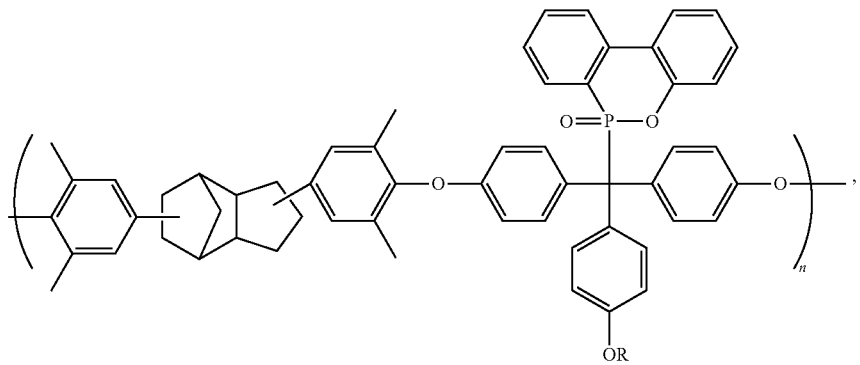

where R is one of groups below,

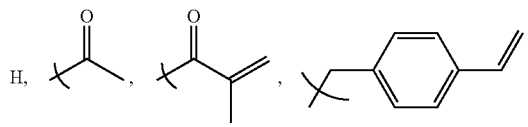

where n=10-100.

The present invention further provides a cured product obtained by heating and curing constituents of the polyether expressed by structural formula (I).

The present invention further provides a method of producing a DCPD-derived polyether expressed by structural formula (I-a), the method comprising the steps of:

(1) allowing a compound expressed by structural formula (A) below

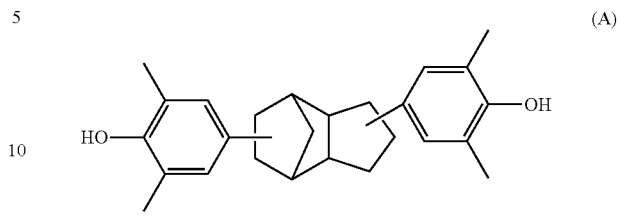

to react with 4,4'-difluorobenzophenone by alkaline catalysis to obtain polymer (B)

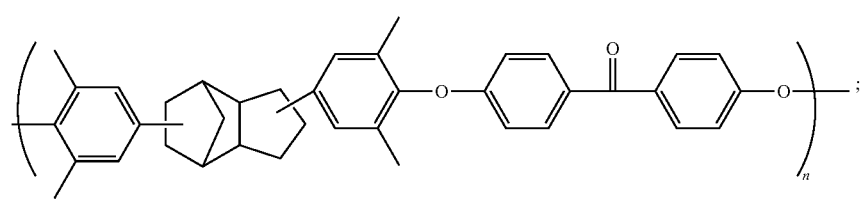

and (2) allowing polymer (B) to react with 9,10-dihydro-9-oxa-10-phosphaphenanthrene-10-oxide (DOPO) and phenol by acid catalysis to obtain DCPD-derived polyether expressed by structural formula (I-a) below,

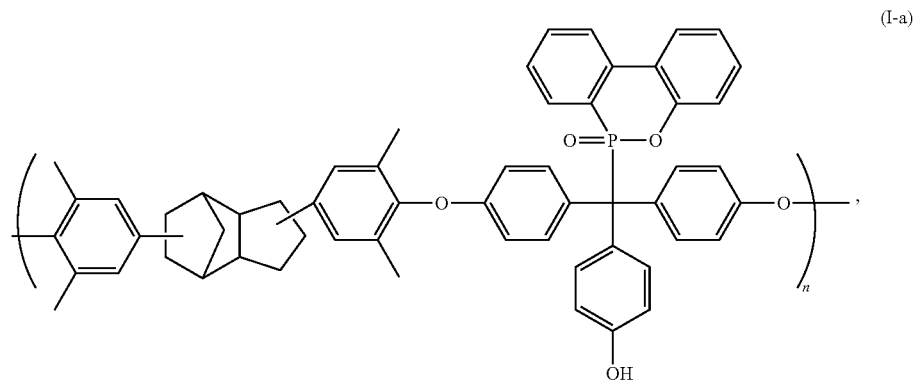

where n=10-100.

In an embodiment of the present invention, an alkali in step (1) is $K_2CO_3$.

In an embodiment of the present invention, the reaction in step (1) further requires p-benzoquinone which functions as a radical inhibitor.

In an embodiment of the present invention, an acid in step (2) is $H_2SO_4$.

In an embodiment of the present invention, the method further comprises allowing the polyether expressed by structural formula (I-a) to react with acetic anhydride by alkaline catalysis to obtain the polyether expressed by structural formula (I-b),

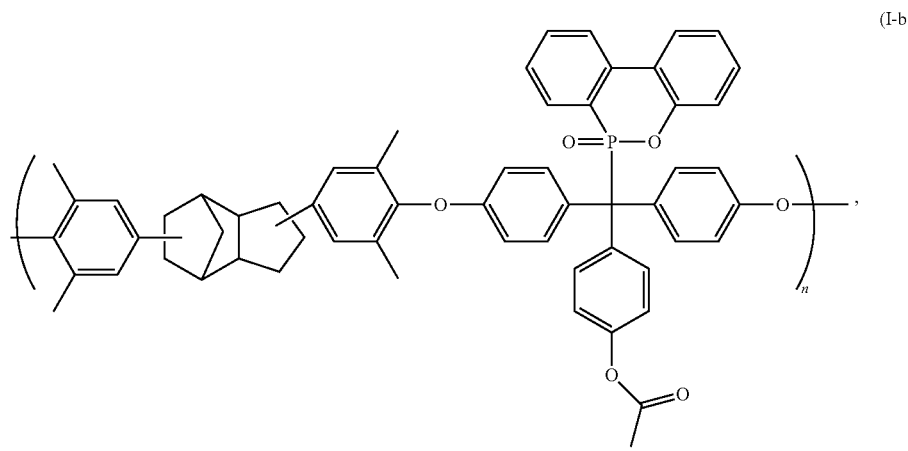

(I-b)

where n=10-100.

In an embodiment of the present invention, the alkali is $K_2CO_3$.

In an embodiment of the present invention, the method further comprises allowing the polyether expressed by structural formula (I-a) to react with methacrylic anhydride by alkaline catalysis to obtain the polyether expressed by structural formula (I-c) below,

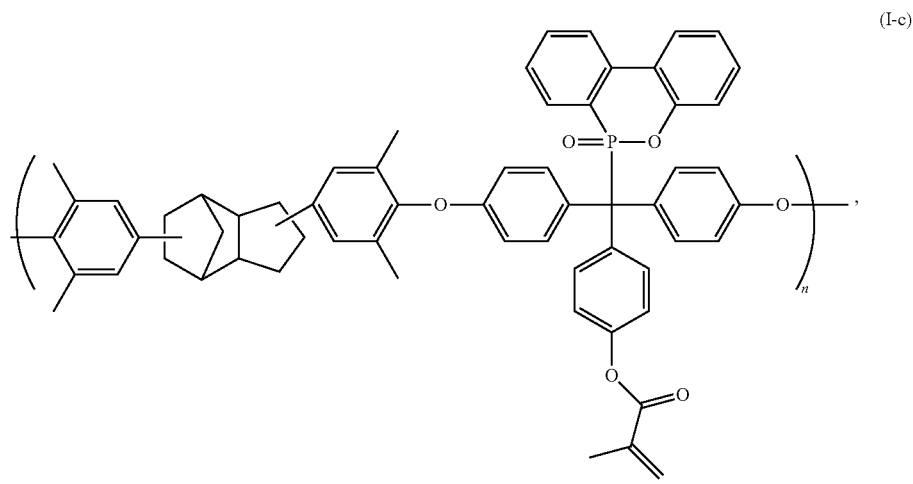

(I-c)

where n=10-100.

In an embodiment of the present invention, the alkali is $K_2CO_3$.

In an embodiment of the present invention, the method further comprises allowing the polyether expressed by structural formula (I-a) to react with 4-vinylbenzyl chloride by alkaline catalysis to obtain the polyether expressed by structural formula (I-d) below,

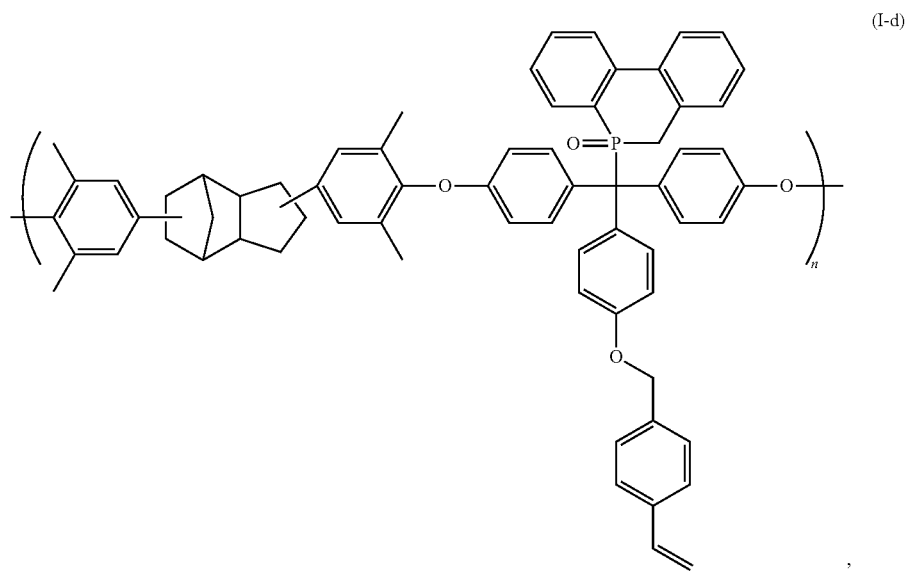

(I-d)

where n=10-100.

In an embodiment of the present invention, the alkali is $K_2CO_3$.

The present invention involves synthesizing a DCPD-derived polyether. Incorporation of a phosphorus group and a DCPD derivative into the DCPD-derived polyether of the present invention enables the DCPD-derived polyether of the present invention to not only serve as an epoxy resin curing agent but also cure itself. The cured DCPD-derived polyether underwent UL-94 flammability combustion test and thus found to be of V-0 rating, a glass transition temperature of around 290° C., char yield (CY) of around 40%, showing that the introduction of a phosphorus group and a DCPD derivative enables the polyether to take on a compact reticular structure as well as have high thermal stability and flame resistance after undergoing double-bond cross-linking. Regarding its electrical characteristics, the DCPD-derived polyether of the present invention has a dielectric constant of less than 2.7 when cured, thereby meeting the present requirement of high-frequency substrates.

The above summary, the detailed description below, and the accompanying drawings further explain the technical means and measures taken to achieve predetermined objectives of the present invention and the effects thereof. The other objectives and advantages of the present invention are explained below and illustrated with the accompanying drawings.

DETAILED DESCRIPTION OF THE PREFERRED EMBODIMENTS

Implementation of the present invention is hereunder illustrated by a specific embodiment. Persons skilled in the art can easily understand other advantages and effects of the present invention by referring to the disclosure contained in the specification.

Incorporation of a phosphorus group and a DCPD derivative into a low-k, non-flammable dicyclopentdiene (DCPD)-derived polyether of the present invention enables the DCPD-derived polyether of the present invention to not only serve as an epoxy resin curing agent but also cure itself such that the cured product not only features satisfactory thermal properties and low-k characteristics but is also non-flammable.

Figure 1:
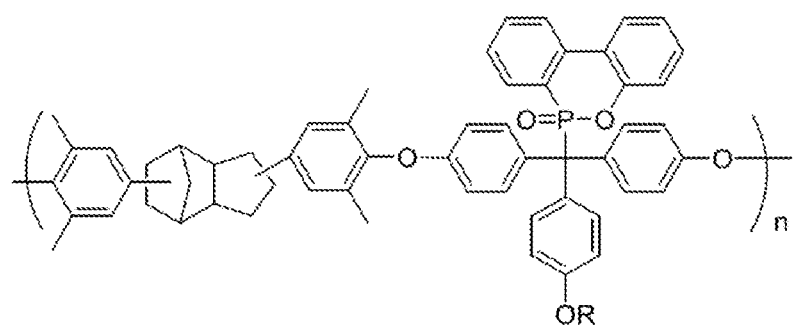
FIG. 1 shows a structural formula of a DCPD-derived polyether of the present invention.
Figure 1:
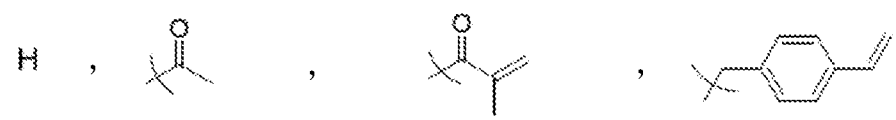
Figure 2:
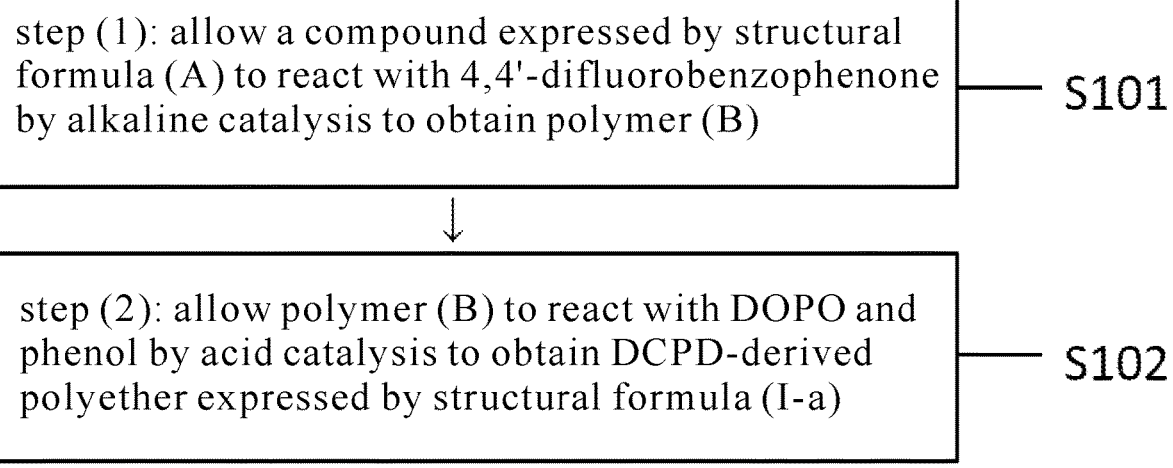
FIG. 2 is a schematic view of the process flow of a method of producing the DCPD-derived polyether of the present invention.

Referring to FIG. 2, there is shown, there is shown a schematic view of the process flow of a method of producing the DCPD-derived polyether of the present invention. As shown in the diagram, the method of producing the DCPD-derived polyether of the present invention comprises steps of: (1) allowing a compound expressed by structural formula (A) below

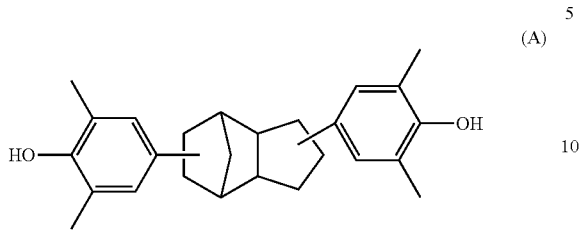

(A)

to react with 4,4'-difluorobenzophenone by alkaline catalysis to obtain polymer (B)

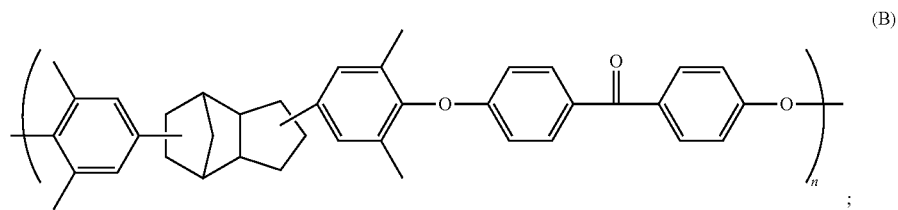

(B)

;

and (2) allowing polymer (B) to react with 9,10-dihydro-9-oxa-10-phosphaphenanthrene-10-oxide (DOPO) and phenol by acid catalysis to obtain DCPD-derived polyether expressed by structural formula (I-a) below,

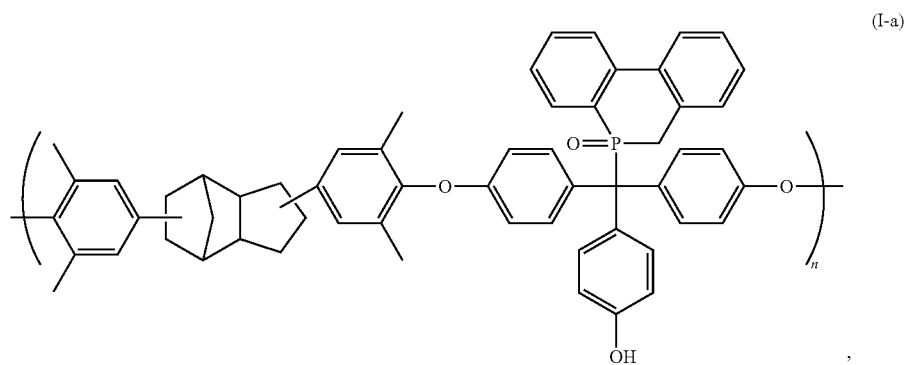

(I-a)

, where n=10-100.

In an embodiment of the present invention, the method further comprises allowing the polyether expressed by structural formula (I-a) to react with acetic anhydride by alkaline catalysis to obtain the polyether expressed by structural formula (I-b),

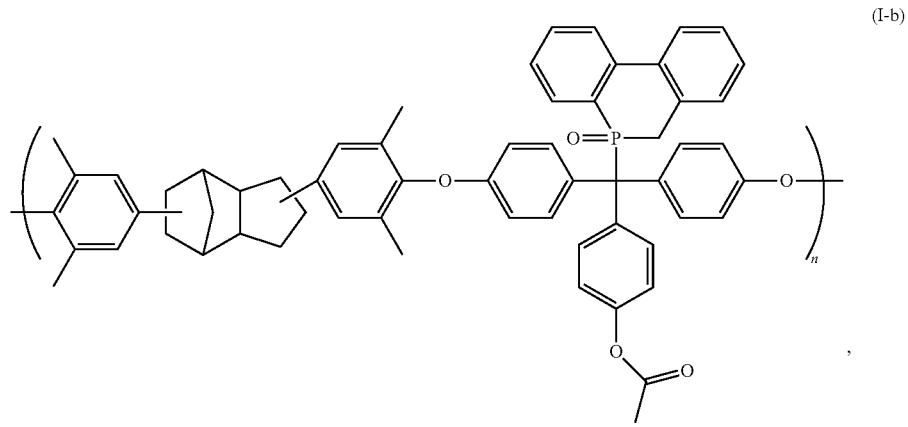

(I-b)

where n=10-100.

In an embodiment of the present invention, the method further comprises allowing the polyether expressed by structural formula (I-a) to react with methacrylic anhydride by alkaline catalysis to obtain the polyether expressed by structural formula (I-c) below,

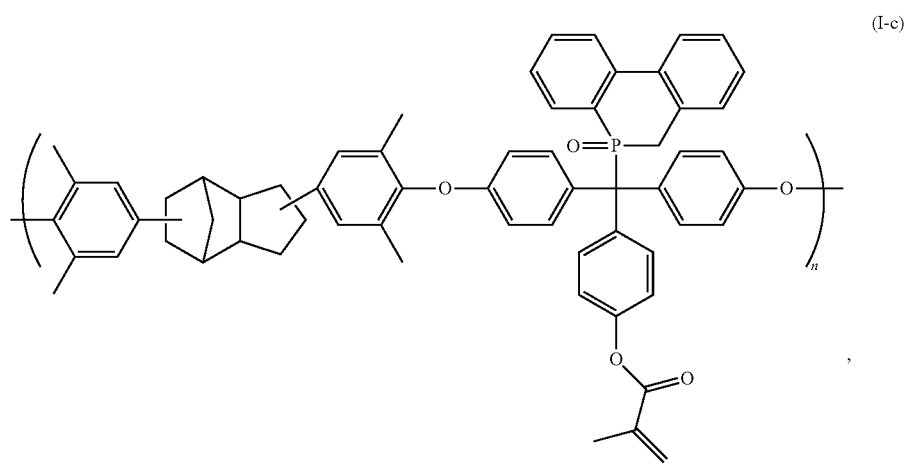

(I-c)

where n=10-100.

In an embodiment of the present invention, the method further comprises allowing the polyether expressed by structural formula (I-a) to react with 4-vinylbenzyl chloride by alkaline catalysis to obtain the polyether expressed by structural formula (I-d) below,

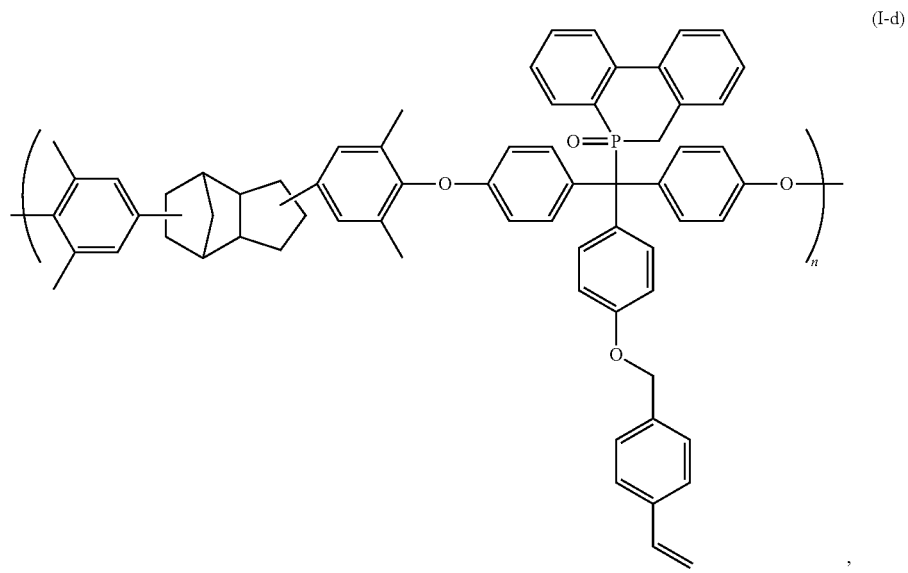

(I-d)

where n=10-100.

Embodiment

Figure 3A:
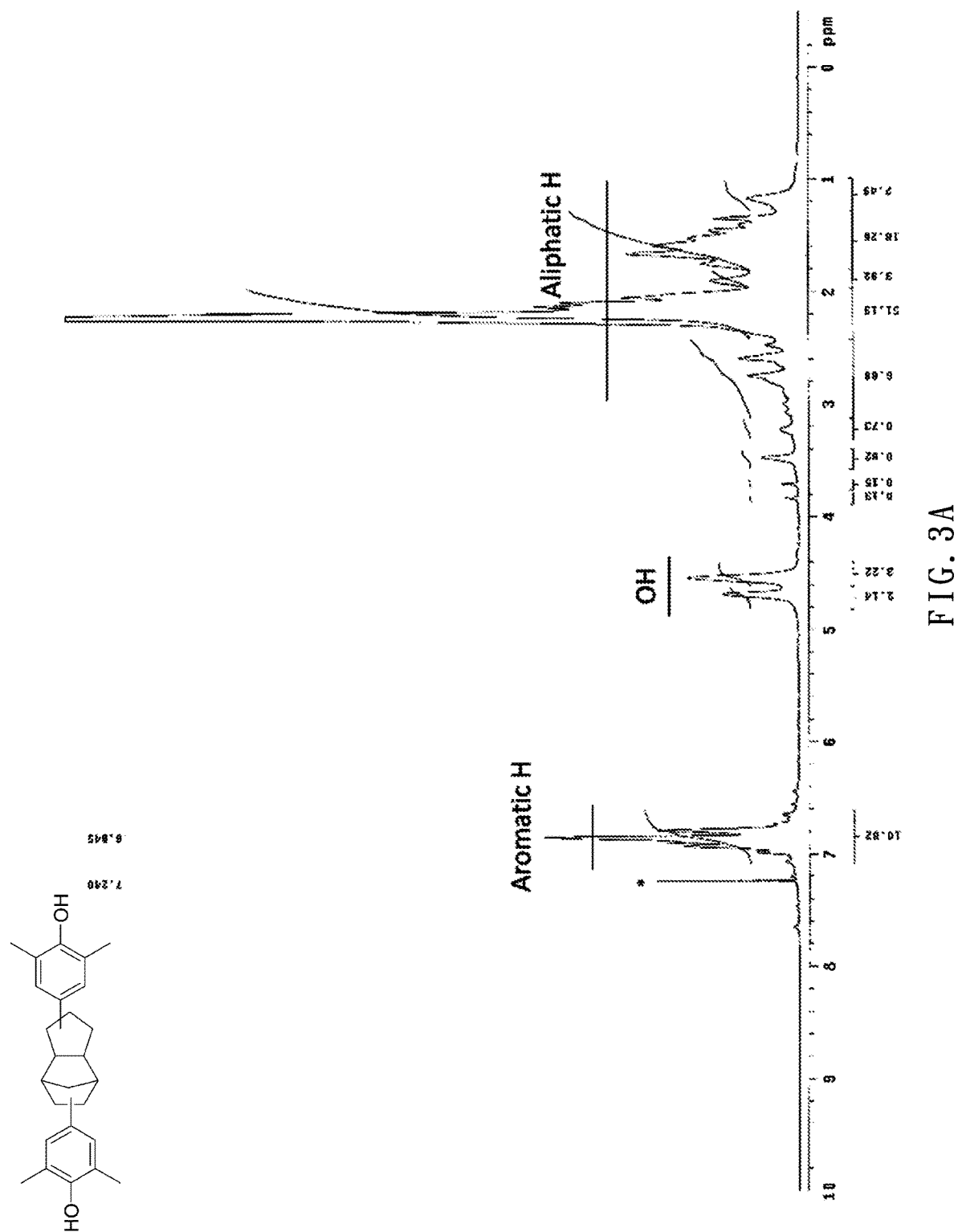
FIG. 3A is a 600 MHz $^1$H-NMR spectrum of the DCPD-2,6-diol in a $CDCl_3$ solution.
Figure 3B:
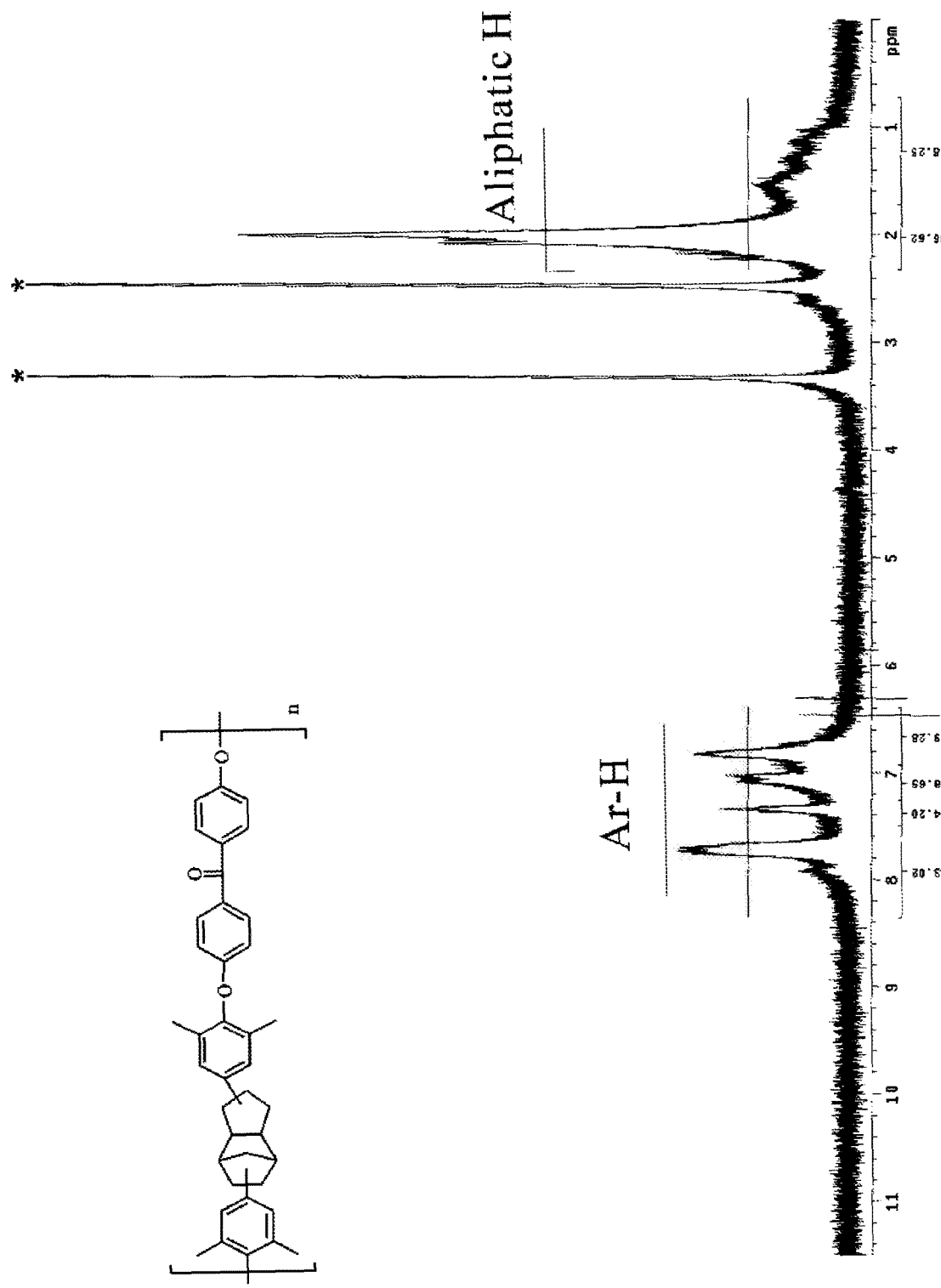
FIG. 3B is a $^1$H-NMR spectrum of the DCPD-derived polyether according to embodiment 1 of the present invention.

Embodiment 1: 87.3 g (0.714 mol) of 2,6-dimethyl phenol and 2.0 g (0.015 mol) of $AlCl_3$ were added to a 250 mL three-neck reactor, stirred in a nitrogen atmosphere, and heated to 120° C. Then, 12.32 g (0.100 mol) of dicyclopentadiene (DCPD) was pipetted into the 250 mL three-neck reactor to undergo a reaction for 6 hours. Upon completion of the reaction, 0.060 mol of 5 wt % NaOH (aq) was added to the 250 mL three-neck reactor and stirred for one hour. Afterward, the resultant solution underwent suction filtration, and the resultant filtrate was rinsed thrice with deionized water. The organic layer of the rinsed filtrate was concentrated under reduced pressure to remove a surplus portion of 2,6-dimethyl phenol. Afterward, the product thus preliminarily concentrated under reduced pressure was dissolved in toluene and then extracted several times with deionized water such that the organic layer was concentrated under reduced pressure to remove the toluene and water, thereby obtaining dark brown DCPD-2,6-diol solid expressed by structural formula (A). Referring to FIG. 3B, there is shown a $^1$H-NMR spectrum of the DCPD-derived polyether according to embodiment 1 of the present invention. As shown in the FIG. 3A, there is shown a 600 MHz $^1$H-NMR spectrum of the DCPD-2,6-diol in a $CDCl_3$ solution, which shows a characteristic peak of an alkyl group of DCPD and a characteristic peak of a methyl group of dimethyl phenol at 1.0 ppm~2.8 ppm, a characteristic peak of a benzene ring at 6.6 ppm~7.0 ppm, and a characteristic peak of OH of the benzene ring at 4.43 ppm~4.76 ppm. Considering the aforesaid findings, it was confirmed that monomer DCPD-2,6-diol were successfully synthesized. Afterward, DCPD-2,6-diol undergoes nucleophilic substituted polymerization with 4,4'-difluorobenzophenone by alkaline catalysis by following steps as follows: 10 g (0.0245 mole) of DCPD-2,6-diol, 5.795 g (0.0245 mole) of 4,4'-difluorobenzophenone, 6.28 g of (0.0245×2 mol) of $K_2CO_3$, 0.1 g of p-benzoquinone, 10 mL of xylene, and 47.39 g of N-methyl-2-pyrrolidinone (NMP) were added to a 100 mL three-neck reactor, and then the resultant solution was heat therein in a nitrogen atmosphere to 150° C. to react for 24 hours with xylene as an azeotropic agent; upon completion of the reaction, methanol was added to the 100 mL three-neck reactor to precipitate a black solid; the resultant solution was rinsed with methanol and water and then subjected to suction filtration; the resultant filter cake was dried in vacuum at 70° C. to obtain a black solid product, that is, polymer (B). Referring to FIG. 3B, there is shown a $^1$H-NMR spectrum of the DCPD-derived polyether according to embodiment 1 of the present invention. As shown in the diagram, a 400 MHz $^1$H-NMR spectrum of polymer (B) in DMSO-$d_6$ deuterated solution shows the disappearance of a characteristic peak of Ar—OH of DCPD bisphenol monomer derivative at 7.9 ppm and the appearance of a characteristic peak of Ar—H of DCPD bisphenol monomer derivative at 6.6~7.8 ppm. Considering the findings, it was confirmed that polymer (B) was successfully synthesized.

Comparison 1: 10 g (0.0245 mole) of DCPD-2,6-diol, 5.795 g (0.0245 mole) of 4,4'-difluorobenzophenone, 6.28 g (0.0245×2 mol) of $K_2CO_3$, 10 mL of xylene and 47.39 g of NMP were added to a 100 mL three-neck reactor and heated therein in a nitrogen atmosphere to 180° C. to react for 6 hours with xylene as an azeotropic agent. However, the reaction ended up with gelation and yielded no polymer of structural formula (B).

Comparison 2: comparison 2 is substantially the same as comparison 1 but different from comparison 1 in that comparison 2 requires the reaction to take place at 150° C. for 8 hours. However, the reaction ended up with gelation and yielded no intended product.

Comparison 3: comparison 3 is substantially the same as comparison 1 but different from comparison 1 in that comparison 3 requires the reaction to

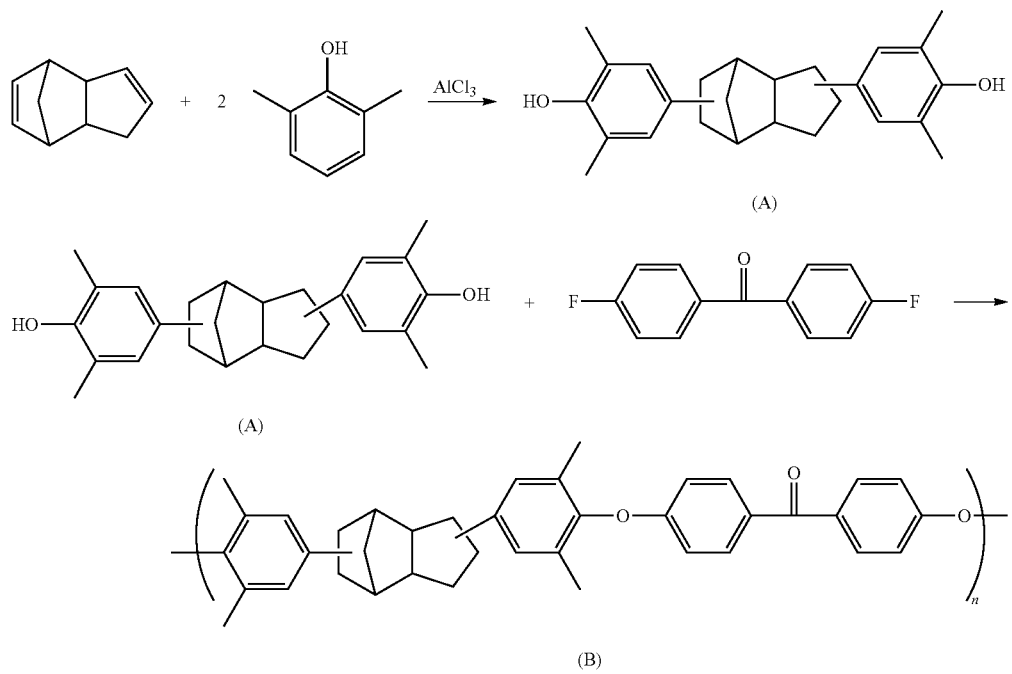

(A)

(B)

take place at 120° C. for 10 hours. However, the reaction ended up with gelation and yielded no intended product.

Comparison 4: 10 g (0.0245 mole) of DCPD-2,6-diol, 5.795 g (0.0245 mole) of 4,4'-difluorobenzophenone, 7.44 g (0.0245×2 mol) of CsF, 10 mL of xylene and 47.39 g of NMP were added to a 100 mL three-neck reactor and heated therein in a nitrogen atmosphere to 150° C. to react for 24 hours with xylene as an azeotropic agent. Upon completion of the reaction, the resultant solution was introduced into methanol to precipitate a black solid. Afterward, the black solid was rinsed with methanol and water and then underwent suction filtration. Finally, the resultant filter cake was dried in vacuum at 70° C. to obtain a black solid product. However, the findings in a NMR spectrum show that the reaction did not yield polymer (B).

Gelation occurs in the course of producing polymer (B) and remains unabated despite lowering the reaction temperature and extending the reaction duration (as in comparisons 1, 2, 3). The reaction does not even occur when the catalyst is changed (as in comparison 4), because in the course of the reaction, the methyl group and C=O may undergo radical coupling and produce a cross-linking product, leading to gelation. In view of this, the present invention is advantageous in that in the course of producing polymer (B) radical inhibitor p-benzoquinone (as in embodiment 1) was introduced to prevent production of radicals such that the reaction took place for 24 hours without causing gelation. Afterward, gel permeation chromatography (GPC) was performed, showing a marked increase in molecular weight.

Figure 4:
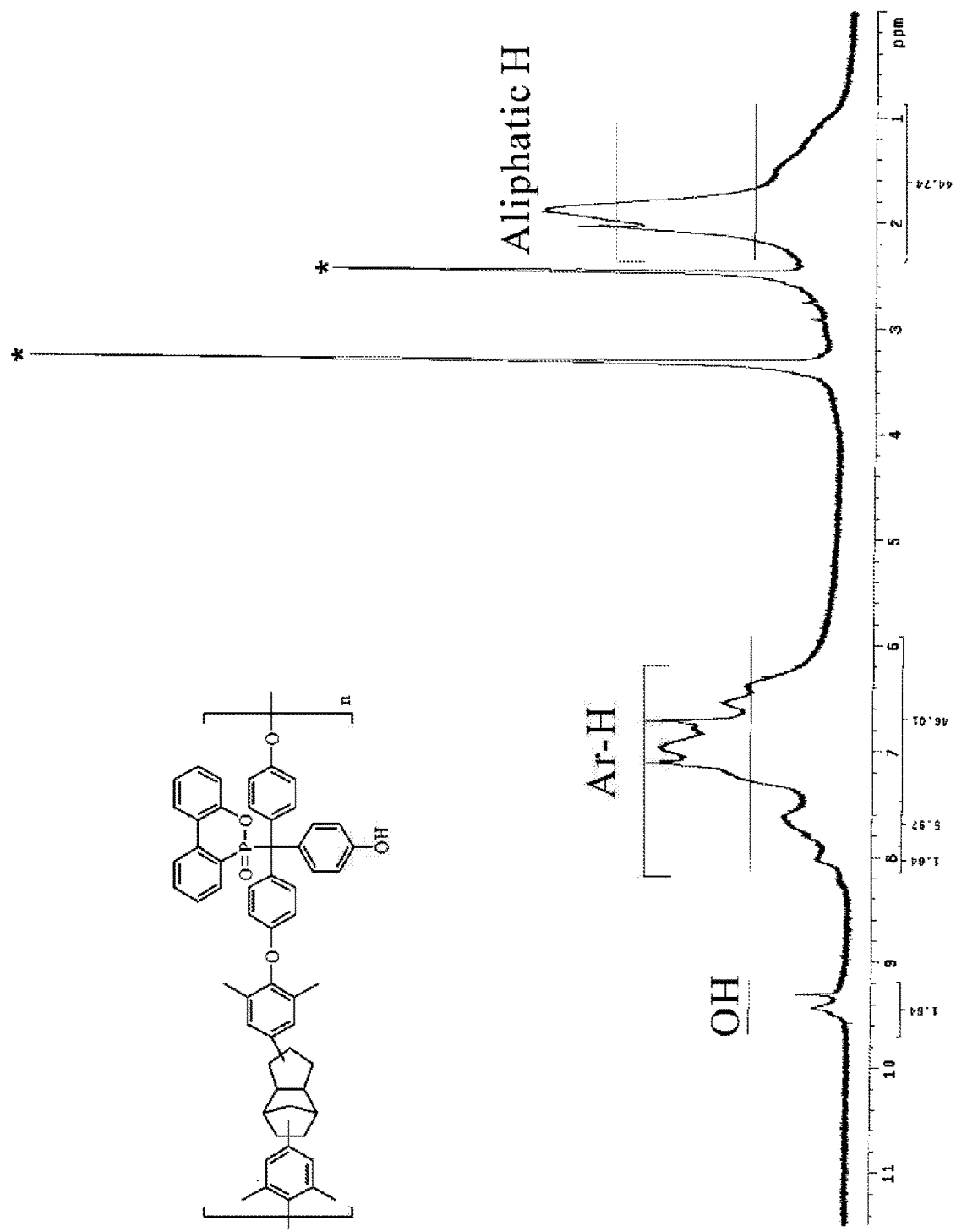
FIG. 4 is a $^1$H-NMR spectrum of the DCPD-derived polyether according to embodiment 2 of the present invention.

Embodiment 2: polymer (I-a) was produced from polymer (B), organic cyclic phosphorus-containing compound, 9,10-dihydro-9-oxa-10-phosphaphenanthrene-10-oxide (DOPO), and excessive phenol by acid catalysis by following the steps as follows: 10 g (0.01796 mol) of polymer (B), 42.7 g (0.01796 mmol) of DOPO, 33.8 g (0.01796×20 mol) of phenol and 0.17 g (4 wt % based on DOPO) of $H_2SO_4$ were added to a 100 mL three-neck reactor and heated therein in a nitrogen atmosphere to 150° C. to react for 24 hours. Upon completion of the reaction, the resultant solution was introduced into methanol to precipitate a black solid. Afterward, the black solid was rinsed with methanol and water and then underwent suction filtration. Finally, the resultant filter cake was dried in vacuum at 60° C. to obtain a black powder product as expressed by structural formula (I-a). Referring to FIG. 4, there is shown a $^1$H-NMR spectrum of the DCPD-derived polyether according to embodiment 2 of the present invention. As shown in the diagram, a 400 MHz $^1$H-NMR spectrum of polymer (I-a) in DMSO-$d_6$ deuterated solution shows a characteristic peak of Ar—OH at 9.4 ppm, proving that polymer (I-a) was successfully synthesized.

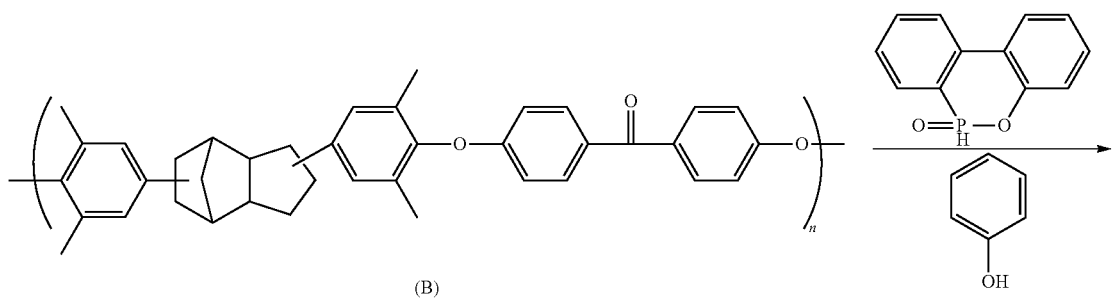

(B)

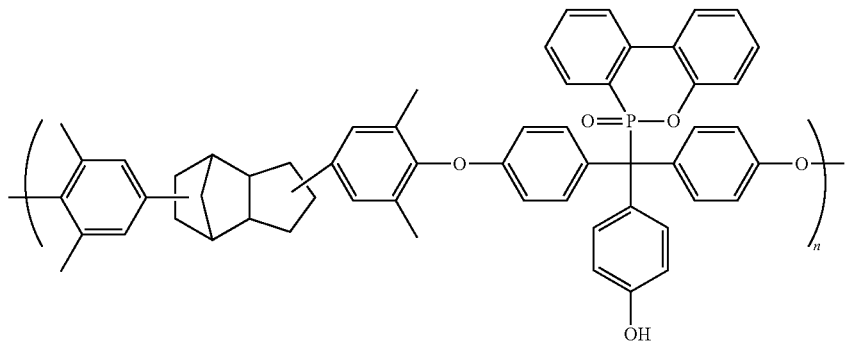

(I-a)

Figure 5:
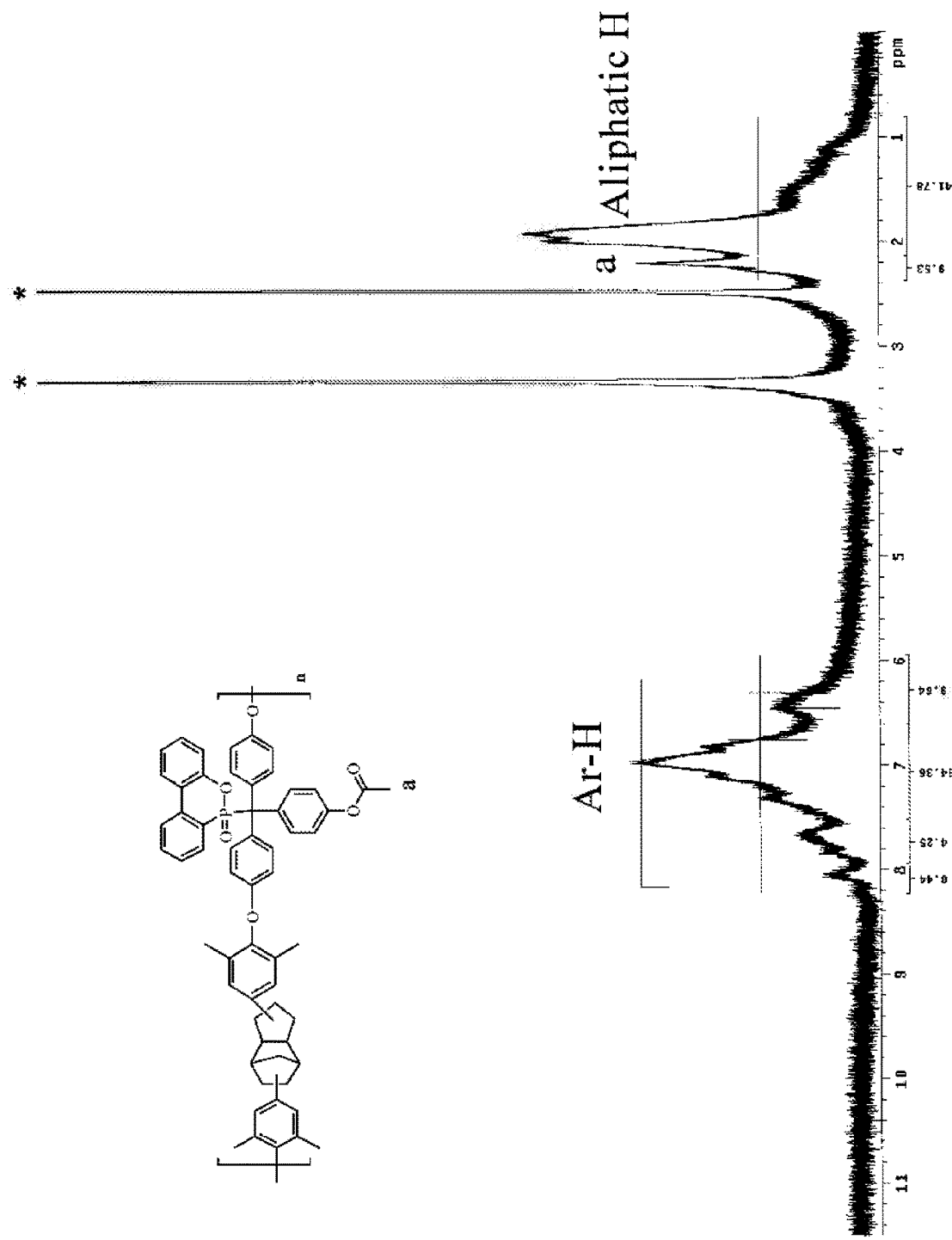
FIG. 5 is a $^1$H-NMR spectrum of the DCPD-derived polyether according to embodiment 3 of the present invention.

Embodiment 3: 1.00 g (0.00112 mol) of polymer (I-a), 0.8 g (0.00112×7 mole) of acetic anhydride, 0.01 g of sodium acetate and 10 mL of N, N-dimethyl acetamide (DMAc) were added to a 100 mL three-neck reactor and heated therein in a nitrogen atmosphere to 130° C. to react for 12 hours. Upon completion of the reaction, the resultant solution was introduced into water to precipitate a black solid. Afterward, the black solid was rinsed with methanol and water and then underwent suction filtration. Finally, the resultant filter cake was dried in vacuum at 70° C. to obtain a black solid product expressed by structural formula (I-b). Referring to FIG. 5, there is shown a $^1$H-NMR spectrum of the DCPD-derived polyether according to embodiment 3 of the present invention. As shown in the diagram, a 400 MHz $^1$H-NMR spectrum of polymer (I-b) in DMSO-$d_6$ deuterated solution shows the disappearance of a characteristic peak of Ar—OH at 9.4 ppm and the appearance of a characteristic peak of $CH_3$ at 2.2 ppm. Considering the findings, it was confirmed that polymer (I-b) was successfully synthesized.

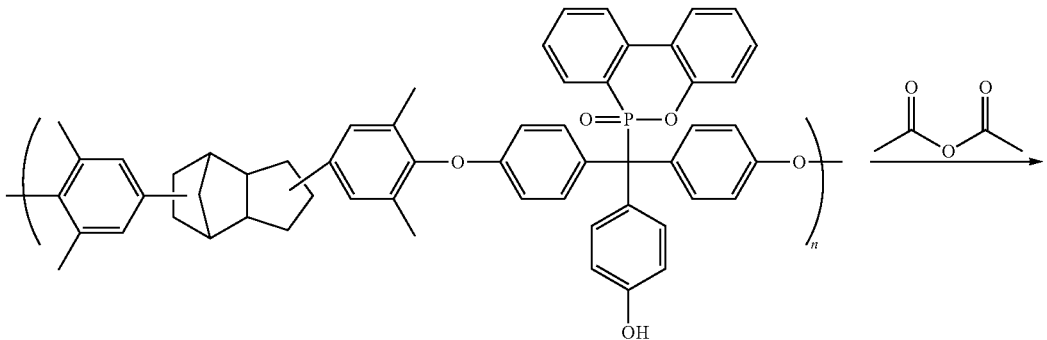

(I-a)

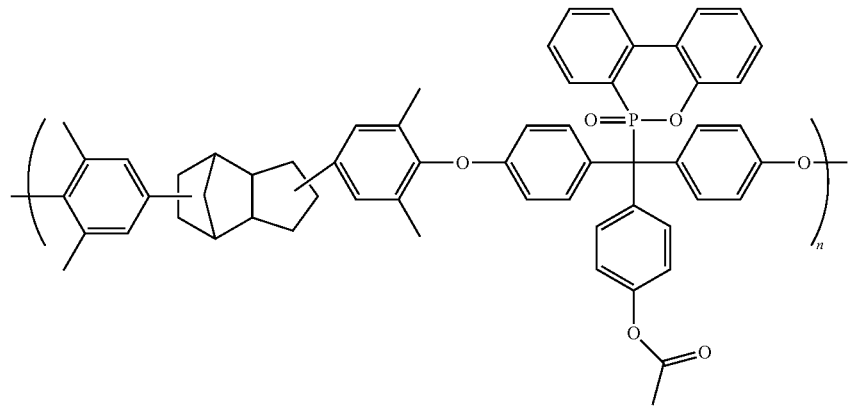

(I-b)

Figure 6:
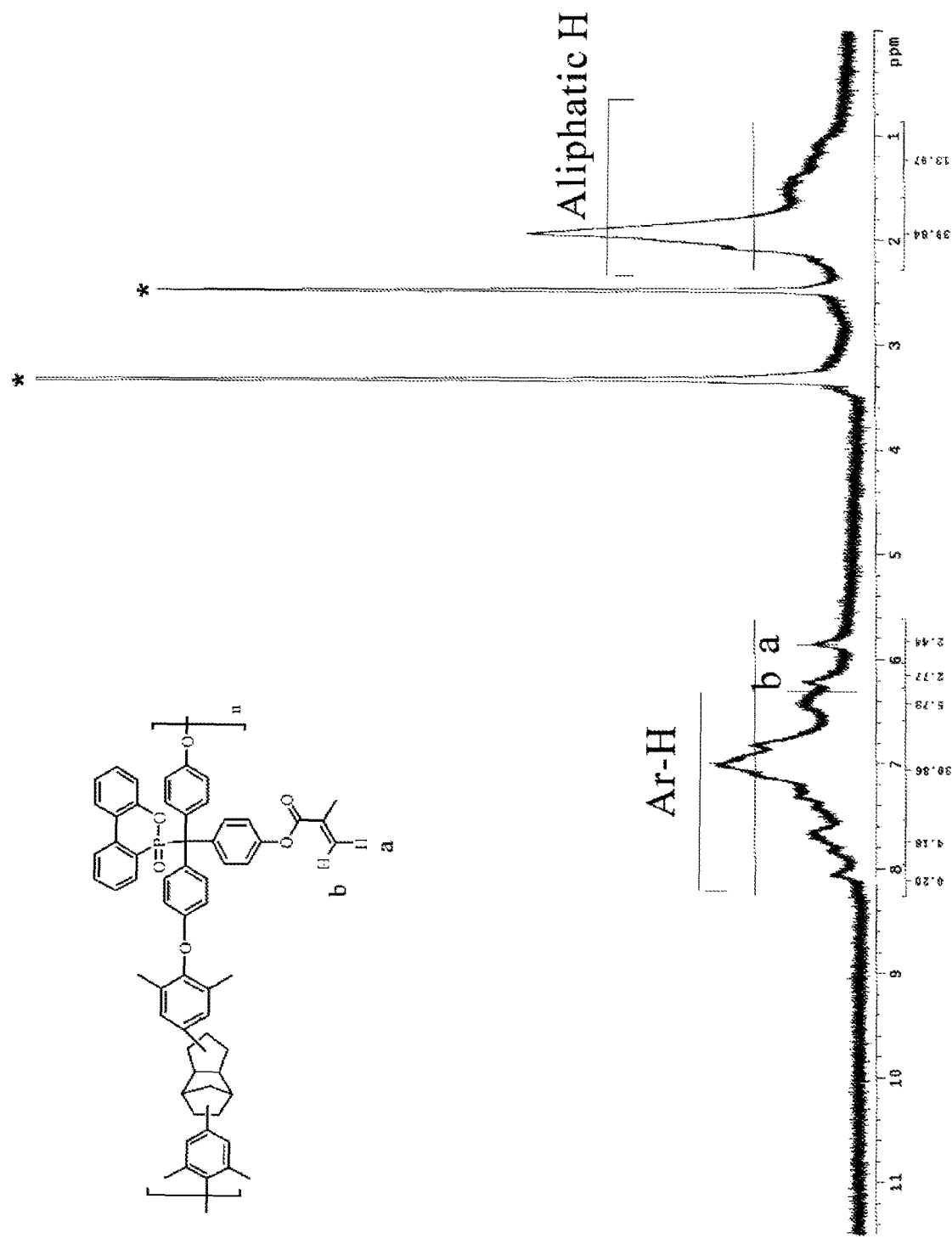
FIG. 6 is a $^1$H-NMR spectrum of the DCPD-derived polyether according to embodiment 4 of the present invention.

Embodiment 4: 1.00 g (1.12 mmol) of polymer (I-a), 0.345 g (1.12*2 mmole) of methacrylic anhydride, 0.01 g of sodium acetate and 10 mL of DMAc were added to a 100 mL three-neck reactor and heated therein in a nitrogen atmosphere to 80° C. to react for 12 hours. Upon completion of the reaction, the resultant solution was introduced into water to precipitate a black solid. Afterward, the black solid was rinsed with methanol and water and then underwent suction filtration. Finally, the resultant filter cake was dried in vacuum at 70° C. to obtain a black solid product expressed by structural formula (I-c). Referring to FIG. 6, there is shown, a $^1$H-NMR spectrum of the DCPD-derived polyether according to embodiment 4 of the present invention. As shown in the diagram, a 400 MHz $^1$H-NMR spectrum of polymer (I-c) in DMSO-$d_6$ deuterated solution shows a characteristic peak of a benzene ring at 6.0 ppm through 8.2 ppm, a characteristic peak of aliphatic at 1.0 ppm through 2.0 ppm, and a characteristic peak of Ha and Hb at 5.8 and 6.2 ppm, but absence of a characteristic peak of residual OH, proving that the end product has a correct structure.

Figure 7:
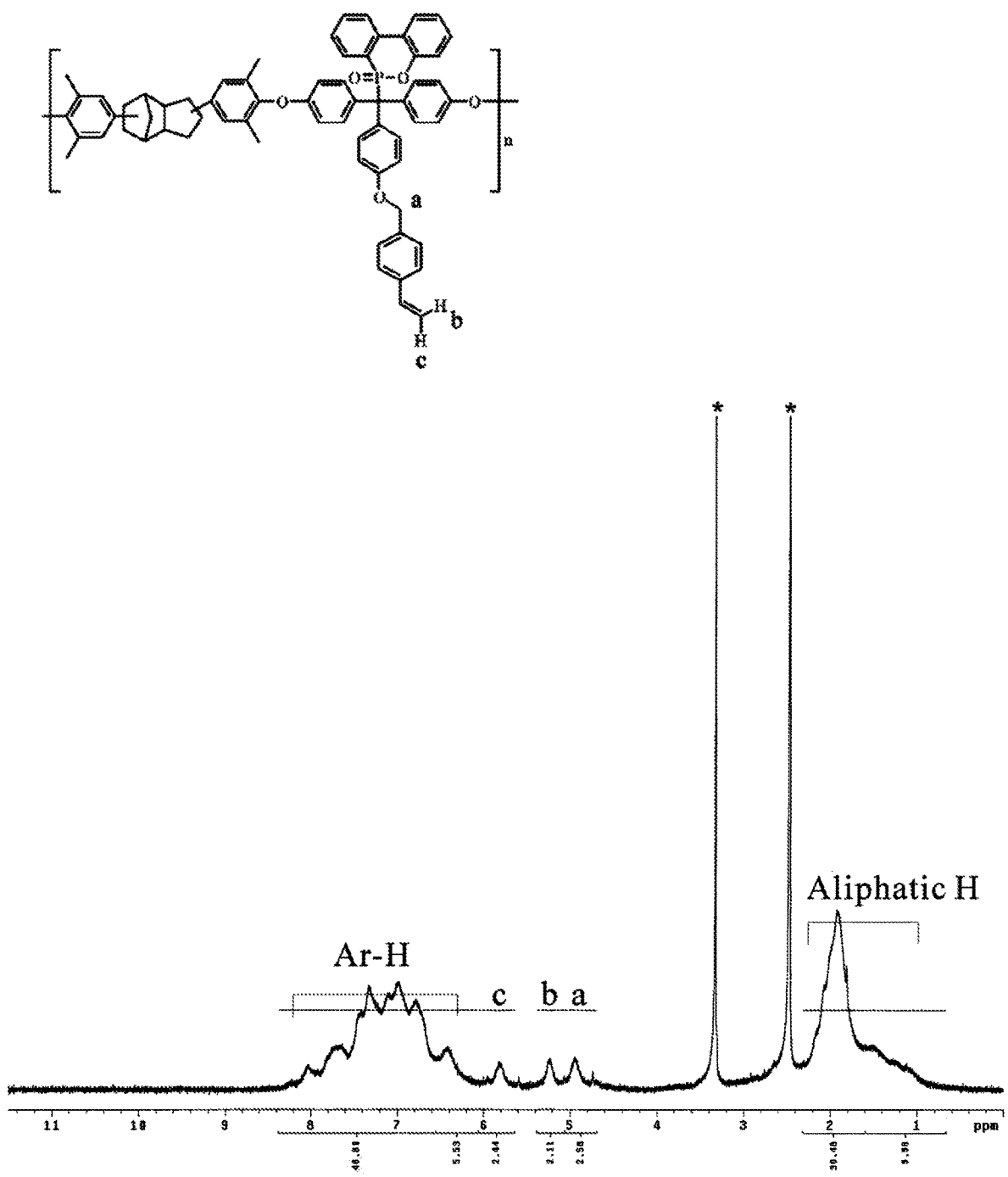
FIG. 7 is a $^1$H-NMR spectrum of the DCPD-derived polyether according to embodiment 5 of the present invention.

Embodiment 5: 1.00 g (1.12 mmol) of polymer (I-a), 0.204 g (1.12/0.92*1.1 mmole) of 4-vinylbenzyl chloride, 0.17 g (1.12*1.1 mmol) of $K_2CO_3$ and 10 mL of DMAc were added to a 100 mL three-neck reactor and heated therein in a nitrogen atmosphere to 80° C. to react for 12 hours. Upon completion of the reaction, the resultant solution was introduced into water to precipitate a black solid. Afterward, the black solid was rinsed with methanol and water and then underwent suction filtration. Finally, the resultant filter cake was dried in vacuum at 70° C. to obtain a black solid product expressed by structural formula (I-d). Referring to FIG. 7, there is shown a $^1$H-NMR spectrum of the DCPD-derived polyether according to embodiment 5 of the present invention. As shown in the diagram, a $^1$H-NMR spectrum of polymer (I-d) in DMSO-$d_6$ deuterated solution shows a characteristic peak of a benzene ring at 6.0 ppm through 8.2 ppm and a characteristic peak of aliphatic at 1.0 ppm through 2.0 ppm, a characteristic peak of Ha at 4.9 ppm, and a characteristic peak of Hb and Hc at 5.2 ppm and 5.8 ppm, but absence of a characteristic peak of residual OH, proving that the end product has a correct structure.

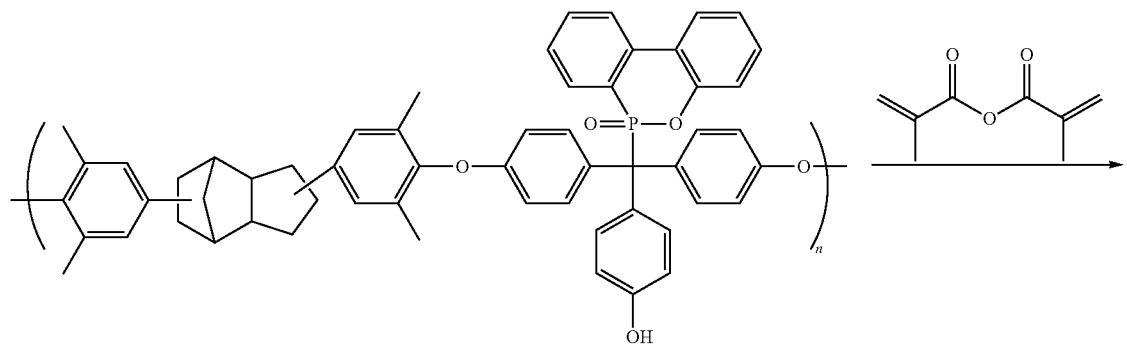

(I-a)

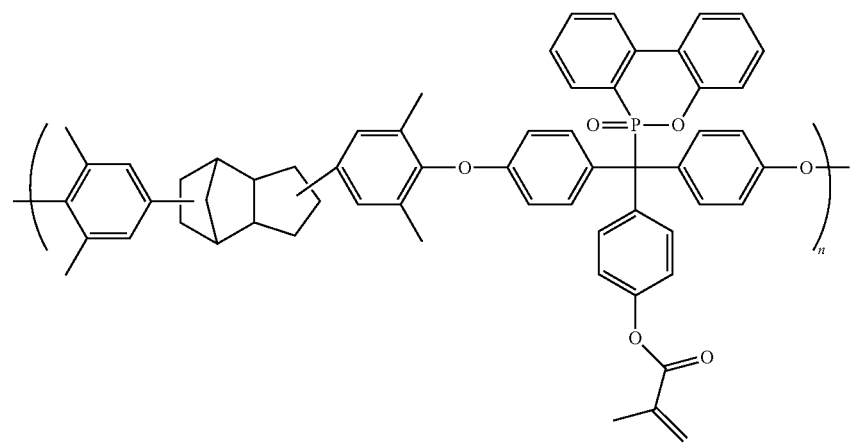

(I-c)

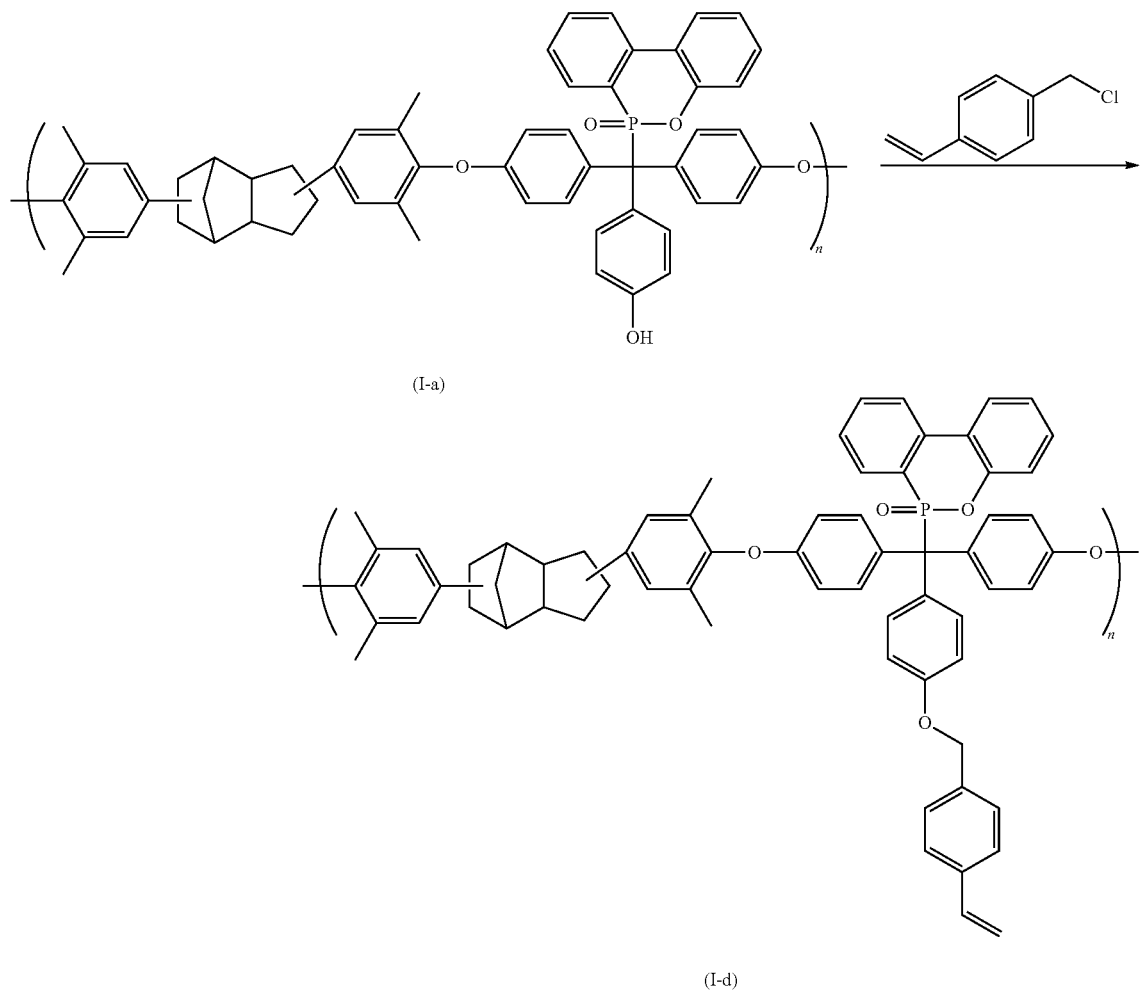

(I-a)

(I-d)

Embodiment 6: allowing polymer (I-b) to cure commercially-available epoxy resin HP7200. Dimethyl acetamide (DMAc) is used as a solvent for setting the epoxy resin to polymer (I-b) equivalent ratio to 1:1 such that the resultant solution has solids content of 30 wt %. Afterward, 4-dimethylaminopyridine (DMAP), which makes up 0.5 percent of the epoxy resin by weight, was added into an aluminum tray of a diameter of 5 cm. Afterward, the aluminum tray was put in a circulation oven heated stepwise to 100° C. for 12 hours, then 150° C., 180° C., 200° C., and 220° C. each for two hours to undergo stepwise temperature-rising curing. Finally, the epoxy resin was soaked in water to facilitate mold release and thus obtain a brown cured product.

Embodiment 7: embodiment 7 is substantially the same as embodiment 6 but different from embodiment 6 in that embodiment 7 requires replacing polymer (I-b) with polymer (I-c) to obtain a brown cured product by temperature-rising curing.

Embodiment 8: allowing polymer (I-d) to cure itself. Dimethyl acetamide (DMAc) is used as a solvent whereby the resultant polymer (I-d)-containing solution has solids content of 30 wt %. Afterward, tert-butyl cumyl peroxide (TBCP) was added to the aforesaid solution which was then added into an aluminum tray of a diameter of 5 cm. Afterward, the aluminum tray was put in a circulation oven heated stepwise to 100° C. for 12 hours, then 150° C., 180° C., 200° C., and 220° C. each for two hours to undergo stepwise temperature-rising curing. Finally, the epoxy resin was soaked in water to facilitate mold release and thus obtain a brown cured product.

Figure 8:
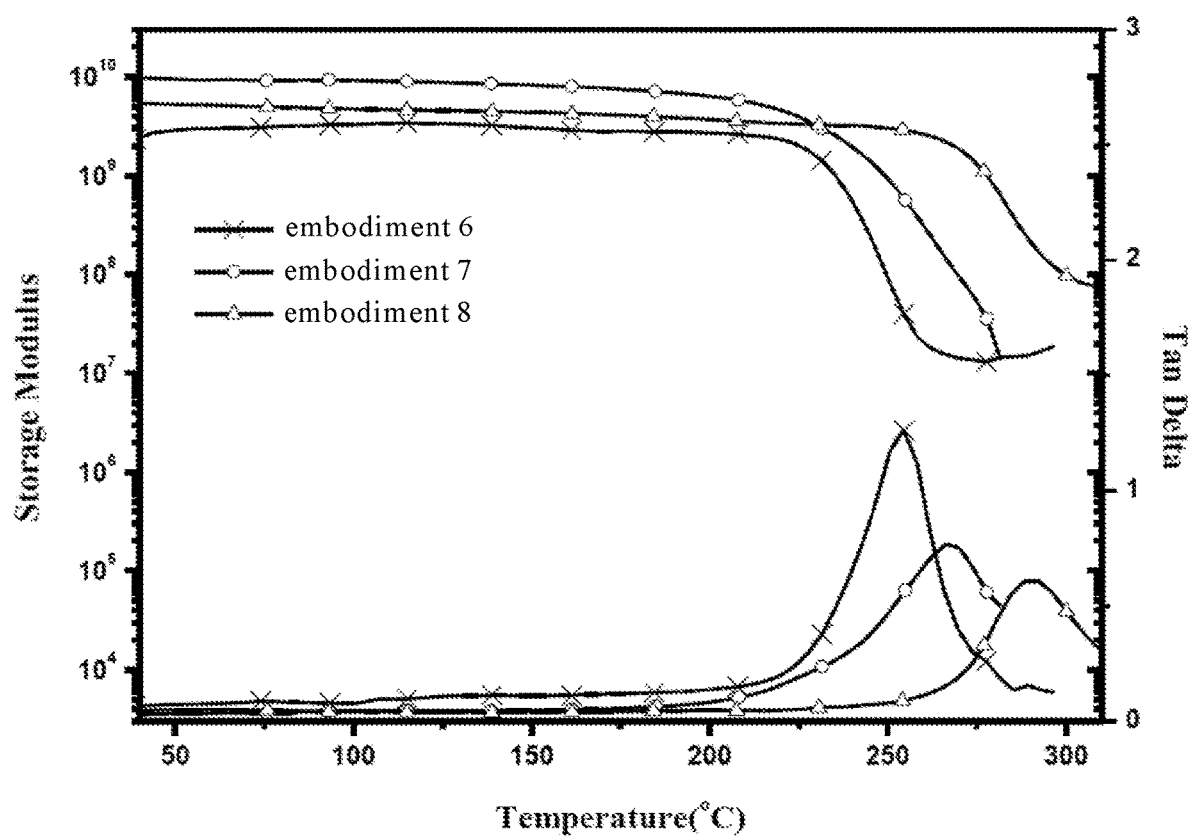
FIG. 8 shows the findings in dynamic mechanical analysis (DMA) of the DCPD-derived polyether according to an embodiment of the present invention.

The glass transition temperatures of the cured products in embodiment 6, embodiment 7, and embodiment 8 were measured with a dynamic mechanical analyzer (DMA) and a dynamic mechanical analyzer (DMA). Furthermore, the cured products were each cut into samples each 20 mm long, 10 mm wide, and 2 mm thick, and then each sample was heated up at a speed of 5° C./min and a frequency of 1 Hz to measure the storage modulus E' thereof and plot the Tan δ curve thereof. Referring to FIG. 8, there is shown the findings in dynamic mechanical analysis (DMA) of the DCPD-derived polyether according to an embodiment of the present invention. As shown in the diagram, the glass transition temperatures in embodiment 6, embodiment 7, and embodiment 8 are 254° C., 267° C., and 289° C., respectively. Embodiment 7 requires double-bond cross-linking and thus features a reticular structure more compact than embodiment 6 and a higher glass transition temperature than embodiment 6. Embodiment 8 features a higher glass transition temperature than embodiments 6, 7 after self-curing.

Figure 9:
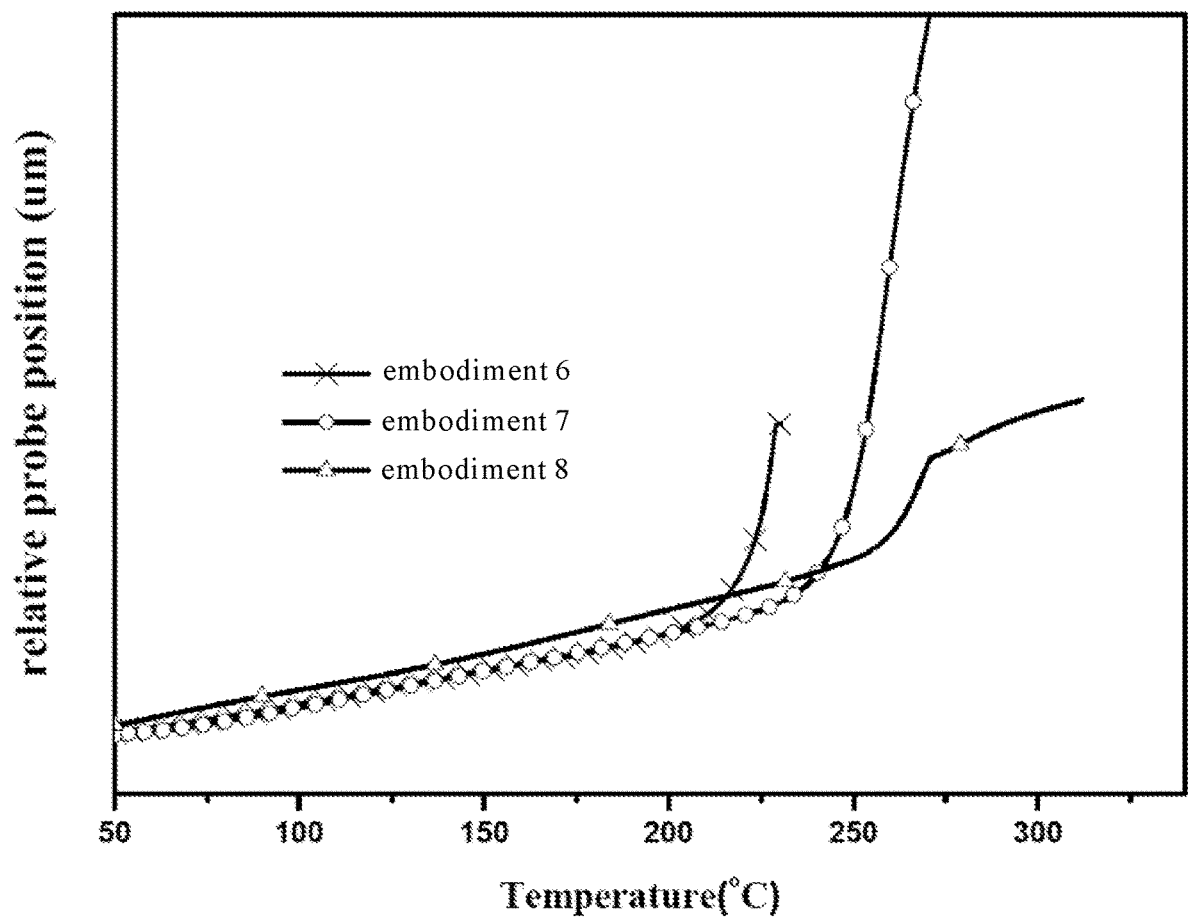
FIG. 9 shows the findings in thermomechanical analysis (TMA) of the DCPD-derived polyether according to an embodiment of the present invention.

The glass transition temperatures of the cured products in embodiment 6, embodiment 7, and embodiment 8 were measured with a thermomechanical analyzer (TMA). Each sample was heated up at a speed of 5° C./min. Referring to FIG. 9, there is shown the findings in thermomechanical analysis (TMA) of the DCPD-derived polyether according to an embodiment of the present invention. As shown in the diagram, the glass transition temperatures in embodiment 6, embodiment 7, and embodiment 8 are 212° C., 245° C., and 258° C., respectively, and the coefficients of thermal expansion (CTE) from 50° C. to 150° C. in embodiment 6, embodiment 7, and embodiment 8 are 49 ppm/° C., 47 ppm/° C., and 49 ppm/° C., respectively, showing that the trend of the glass transition temperatures conforms with DMA.

Figure 10:
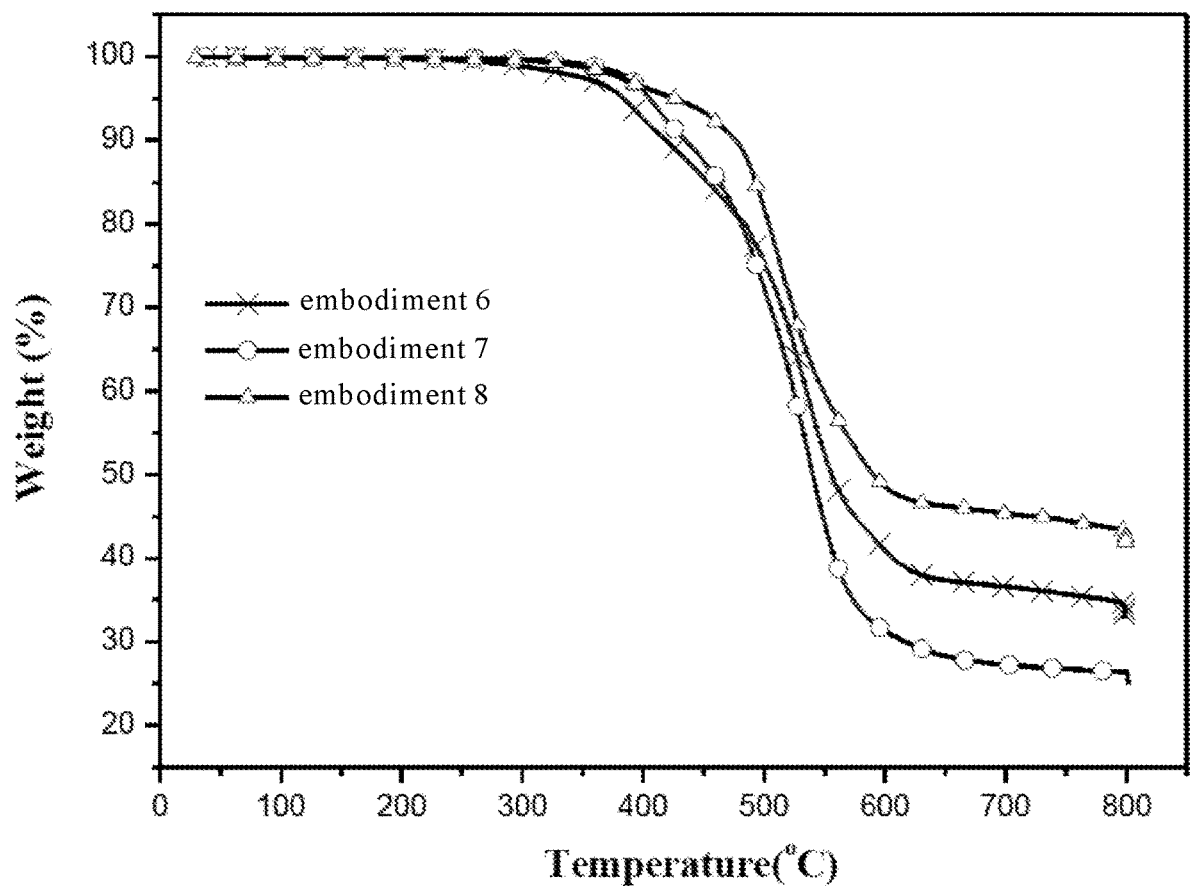
FIG. 10 shows the findings in thermogravimetric analysis (TGA) of the DCPD-derived polyether according to an embodiment of the present invention.

The material thermal stability of the cured products in embodiment 6, embodiment 7, and embodiment 8 was analyzed with a thermogravimetric analyzer (TGA). Referring to FIG. 10, there is shown the findings in thermogravimetric analysis (TGA) of the DCPD-derived polyether according to an embodiment of the present invention. As shown in the diagram, the thermal decomposition 5% temperature (Td5%) in embodiment 6, embodiment 7, and embodiment 8 are 383° C., 405° C., and 426° C., respectively, and the char yield (CY) at 800° C. in the presence of nitrogen in embodiment 6, embodiment 7, and embodiment 8 are 32%, 26%, and 41%, respectively.

Table 1 shows the findings of the thermal analysis of the cured products in embodiment 6, embodiment 7, and embodiment 8, indicating that, upon introduction of a phosphorus group, the cured products still have a satisfactory thermal stability. Finally, the cured products in embodiment 6, embodiment 7, and embodiment 8 underwent UL-94 flammability combustion test and thus were found to be of V-0 rating, showing that the cured product becomes more non-flammable because of introduction of phosphorus-containing DOPO.

TABLE 1

| Embodiment | Tg (° C.) (DMA) | Tg (° C.) (TMA) | CTE (ppm/° C.) | Td5% (° C.) | CY (%) |
|---|---|---|---|---|---|
| Embodiment 6 | 254 | 212 | 49 | 383 | 32 |
| Embodiment 7 | 267 | 245 | 47 | 405 | 26 |
| Embodiment 8 | 289 | 258 | 49 | 426 | 41 |

Regarding analysis of electrical characteristics, dielectric constant (Dk) and dissipation factor (Df) of the cured products in embodiment 6, embodiment 7, and embodiment 8 were measured, and the findings are shown in Table 2. The cured product in embodiment 8 has the least dielectric constant (Dk=2.65) and dissipation factor (Df=0.0095), because it undergoes double-bond cross-linking and thus has a hydrophobic, low-polarity long carbon chain. Similarly, compared with the cured product in embodiment 6, the cured product in embodiment 7 has a hydrophobic, low-polarity long carbon chain and thus a smaller dielectric constant and dissipation factor than embodiment 6. The products each have a dielectric constant of less than 2.76 when cured, thereby meeting the present requirement of high-frequency substrates.

TABLE 2

| Embodiment | Dk (1 GHz) | Df (1 GHz) |
|---|---|---|
| Embodiment 6 | 2.76 | 0.0112 |
| Embodiment 7 | 2.72 | 0.0104 |
| Embodiment 8 | 2.65 | 0.0095 |

After undergoing curing with an epoxy resin, a DCPD-derived polyether of the present invention has low-k characteristics and satisfactory glass transition temperature and is non-flammable to not only serve as an epoxy resin curing agent but also cures itself. The DCPD-derived polyether of the present invention not only has low-k characteristics, high thermal properties, and non-flammability but is also applicable to substrates of printed circuit boards, thereby having wide applications.

The above embodiments are illustrative of the features and effects of the present invention rather than restrictive of the scope of the substantial technical disclosure of the present invention. Persons skilled in the art may modify and alter the above embodiments without departing from the spirit and scope of the present invention. Therefore, the scope of the protection of rights of the present invention should be defined by the appended claims.

What is claimed is:

1. A dicyclopentdiene (DCPD)-derived polyether expressed by structural formula (I) below,

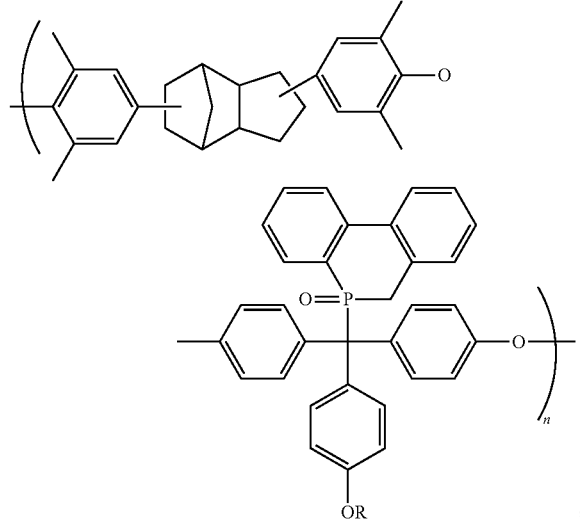

(I)

where R is,

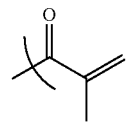

where n=10-100;
wherein the dicyclopentdiene (DCPD)-derived polyether is made by the steps of:
(1) allowing a compound expressed by structural formula (A) below

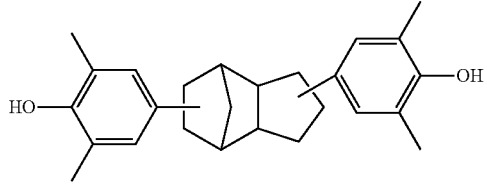

(A)

to react with 4,4'-difluorobenzophenone by alkaline catalysis to obtain polymer (B)

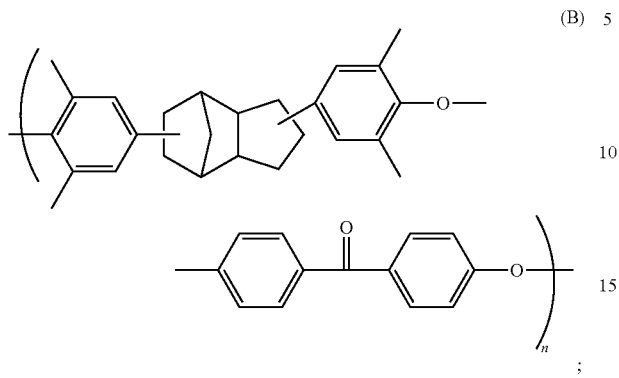

(B)

(2) allowing polymer (B) to react with 9,10-dihydro-9-oxa-10-phosphaphenanthrene-10-oxide (DOPO) and phenol by acid catalysis to obtain DCPD-derived polyether expressed by structural formula (I-a) below,

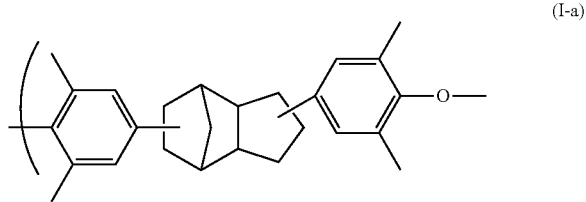

(I-a)

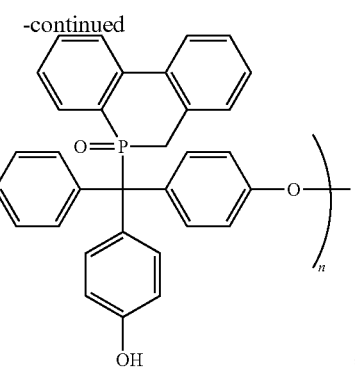

where n=10-100; and (3) allowing the polyether expressed by structural formula (I-a) to react with methacrylic anhydride by alkaline catalysis to obtain the dicyclopentdiene (DCPD)-derived polyether, wherein the DCPD-derived polyether has a glass transition temperature around 290° C.

2. A cured product produced by heating and curing constituents of the polyether of claim 1.

3. The method of claim 1, wherein an alkali in step (1) is $K_2CO_3$.

4. The method of claim 1, wherein the reaction in step (1) further requires p-benzoquinone which functions as a radical inhibitor.

5. The method of claim 1, wherein an acid in step (2) is $H_2SO_4$.

6. The method of claim 1, further comprising allowing the polyether expressed by structural formula (I-a) to react with methacrylic anhydride by alkaline catalysis to obtain the polyether expressed by structural formula (I-c) below,

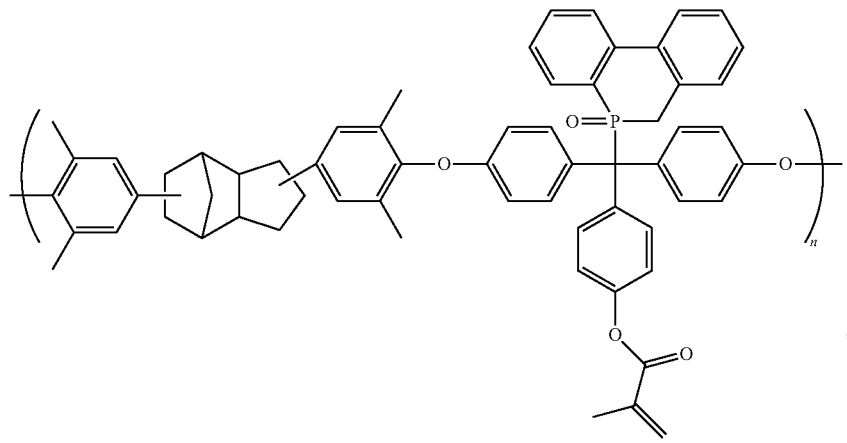

(I-c)

where n=10-100.

7. The dicyclopentdiene (DCPD)-derived polyether of claim 1, wherein the dielectric constant of the dicyclopentdiene (DCPD)-derived polyether is 2.72.

* * * * *